United States Patent [19]
Pickering et al.

[11] Patent Number: 6,107,848
[45] Date of Patent: Aug. 22, 2000

[54] PHASE SYNCHRONISATION

[75] Inventors: Andrew James Pickering, Rugby; Andrew Keith Joy, Great Houghton; Susan Mary Simpson, Towcester, all of United Kingdom

[73] Assignee: Pheonex VLSI Consultants Ltd., Northamptonshire, United Kingdom

[21] Appl. No.: 09/167,989

[22] Filed: Oct. 8, 1998

[30] Foreign Application Priority Data

Oct. 8, 1997 [GB] United Kingdom .................... 9721384

[51] Int. Cl.[7] ........................................ H03K 4/06
[52] U.S. Cl. ................................ 327/146; 327/156
[58] Field of Search .................................. 327/141, 147, 327/155, 156, 162, 163, 238, 243, 244, 246, 254, 119, 120, 358, 146

Primary Examiner—Timothy P. Callahan
Assistant Examiner—Linh Nguyen
Attorney, Agent, or Firm—Watson Cole Grindle Watson, P.L.L.C.

[57] ABSTRACT

Apparatus for producing an oscillating signal in a predetermined phase relationship with an input signal which generates its output signal by mixing in variable proportions two or more reference oscillating signals. Preferably the reference signals should be in quadrature relationship and have approximately the same frequency as the desired output, but this is not essential. The output signal may be desired to be in phase with the input signal or to have a predetermined phase offset. In a further aspect, apparatus is described which generates quadrature related clock signals, which may be used as the reference signals in the phase-lock arrangement.

15 Claims, 6 Drawing Sheets

$\phi_0 = -0.866\, \phi_1 + 0.500\, \phi_2$

FIG. 3a

PHASER DIAGRAM

EQUIVALENT FUNCTION:
IF (INC) {P=P+KF+1; F=F+1}
IF (DEC) {P=P+KF-1; F=F-1}

PHASE SYNCHRONISATION

BACKGROUND OF THE INVENTION

1. Field of the Invention

The present invention relates to devices for synchronising an output signal with an input signal, and in particular to devices which use interpolation or mixing of two reference sources to generate the output.

2. The Prior Art

Phase locked loops (PLLs) are well known electronic devices and they function to provide an output oscillating signal which is phase locked with an incoming signal. In most PLL architectures, the output signal is generated by a voltage controlled oscillator (VCO) and this output is compared by a phase detector with the input signal. This produces an error signal representing the phase difference between the input and the output and this error is applied, typically via an appropriate filter, to alter the control voltage of the VCO. The oscillating frequency of the VCO is therefore altered until such time as the output is in phase with the input at which time no further error signal is generated and no further changes are made to the control voltage input to the VCO.

PLLs are typically used where it is desired to generate a clean clock signal synchronised with an incoming signal. One particular application of PLLs is in data transmission systems, for instance communication devices where the transmitted signal is modulated based on a signal having a particular frequency and it is important to recover a corresponding clock signal at the receiver in order to demodulate the received signal.

In a typical communication system there may be many PLLs in close proximity. For instance there may be PLLs both in the transmit side of the system and in the receive side, and also in a multi-channel system there may be a PLL for each of the channels. If such arrangements are implemented on a single chip problems can occur due to interference between VCOs implemented in such close proximity. Also as data rates increase, the power consumption of the VCO required to generate a satisfactorily low-noise signal increases and this is compounded if more than one VCO is implemented in any particular device.

It is further known that clock signals may be used in a number of parts of any specific electronic circuitry. In a physical implementation therefore clock signals are carried around a chip or circuit board arrangement by suitable conductive means so as to be transferred from the clock generator to the part of the circuitry dependent on the clock.

SUMMARY OF THE INVENTION

The present invention provides, in a first aspect, apparatus for generating an oscillating output signal having a desired phase relationship with an input signal, comprising:

mixing means arranged to receive first and second reference signals oscillating at a common frequency and having a phase offset between them, and to mix said first and second reference signals in variable proportions to generate said output signal; and comparing means arranged to compare the phase of said output signal with said input signal and to provide a comparison output signal indicative of whether the phase of said generated output signal is in said desired phase relationship with said input signal;

said mixing means being responsive to said comparison output signal to alter said proportions in which said first and second reference signals are mixed.

In the preferred embodiment the first and second reference signals are in quadrature relationship with each other. In this arrangement good results are achieved when the mixing means is arranged to mix said first and second reference signals in proportions which vary sinusoidally with the required phase difference between the output and one of said first and second reference signals.

In a particularly preferred implementation the mixing proportion for each of said reference signals is represented by a pair of differential weight current signals. These can be used in an arrangement in which said mixing means comprises a plurality of differential amplifiers with each reference signal being applied to two of said differential amplifiers with opposite polarity and current in said two differential amplifiers being supplied respectively by the corresponding pair of differential weight current signals, the sum of the outputs of said differential amplifiers being used to provide said output signal.

The present invention does not therefore require the presence of a voltage controlled oscillator or other clock source implemented as part of a PLL. Rather it depends on the availability of two or more externally generated reference signals, such as may be available elsewhere in the circuitry as mentioned above.

In a stand-alone implementation of a PLL according to this invention, there is thus no requirement for a VCO, as the reference signals can be generated from any suitable oscillatory source. This potentially reduces the power requirements of the PLL.

In an implementation in the context of a communication system as mentioned above, the receiver PLL may be according to this invention and may derive its reference signals from the VCO output in the transmitter side PLL. This removes the possibility of damaging interference between two VCOs on the same chip and also reduces the overall power requirement. Alternatively, both the transmitter and receiver PLLs may receive input clock reference signals from elsewhere.

This invention is particularly suited to situations such as those referred to above in the communications field where the frequency of the desired output is fairly accurately known as in this case the reference signals would be set to have approximately this frequency. However it is possible and potentially useful within the present invention to generate an output signal having a frequency different from the frequency of the reference signals, and therefore synchronise with an input signal of a different frequency.

The comparison between the input and the output signal in the invention is broadly the same as the prior art, that is a signal is generated according to phase comparison between the input and the output signals. In the invention this is used to derive and constantly correct the weightings used in the mixing of the reference signals.

In alternative arrangements, the two references may be arranged non-orthogonal, in which case the relationships between the derived phase relationships and the weighting values is different but can be easily derived. Also it is possible to use three or more references at equal or non-equal phase spacings with appropriate weighting values.

In another aspect the present invention provides apparatus for generating an output pair of quadrature related signals oscillating at a common frequency, having input thereto an input pair of signals oscillating at said frequency and having a phase difference therebetween, comprising:

summing means arranged to sum said two input signals to generate a first signal;

difference means arranged to subtract one of said input signals from the other to generate a second signal; and output means arranged to generate said output signals from said first and second signals.

Preferably the input signals have a common magnitude, and the magnitudes of said first and second signals are simply equalised in order to provide said output signals.

The quadrature related signals are advantageously used as the reference signals in the PLL, and as will be explained in more detail below a multi-channel communications arrangement can be easily implemented with only one source of clock signals and means arranged to regenerate the quadrature relationship between the clock signals at appropriate points.

BRIEF DESCRIPTION OF THE DRAWINGS

This invention will be better understood from the following description of preferred embodiments which is given by way of example and with reference to the accompanying drawings in which.

DETAILED DESCRIPTION OF THE DRAWINGS

In broad terms, the invention is apparatus for producing an oscillating signal in a predetermined phase relationship with an input signal which generates its output signal by mixing in variable proportions two or more reference oscillating signals. Preferably the reference signals should be in quadrature relationship and have approximately the same frequency as the desired output, but this is not essential. The output signal may be desired to be in phase with the input signal or to have a predetermined phase offset. In a further aspect, apparatus is described which generates quadrature related clock signals, which may be used as the reference signals in the phase-lock arrangement.

Figure 1:
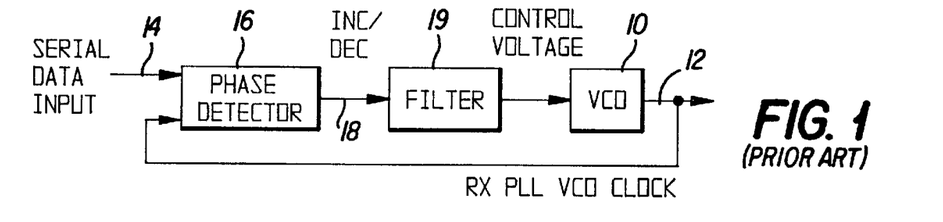
FIG. 1 is a schematic drawing of a prior art PLL.

FIG. 1 illustrates in schematic form a schematic diagram of a prior art PLL the operation of which is useful to understand for the understanding of the present invention. The PLL illustration in FIG. 1 comprises a voltage controlled oscillator (VCO) 10 which has a control voltage applied to it and which outputs a clock signal 12. As is well known the frequency of the output 12 is a function of the magnitude of the control voltage enabling the frequency of output 12 to be controlled by varying the control voltage. The PLL has input to it a signal 14, for instance a data signal based on a remotely derived clock signal, and it is desired that clock signal 12 should be synchronised with input signal 14. These two signals are compared by phase detector 16 which compares the phases of the two signals in order to generate a signal 18 according to the phase difference between signals 12 and 14. In particular, signal 18 indicates whether the frequency of output signal 12 needs to increase or decrease in order to bring signals 12 and 14 more in phase with each other. Finally, the illustrated PLL comprises filter 19 (which may essentially be integrating signal 18) which provides the control voltage for VCO 10 such that the control voltage increases and decreases according to signal 18.

A PLL is therefore essentially a closed loop control system which compares the input and the output and controls the generation of the output according to the result of that comparison.

Figure 2:
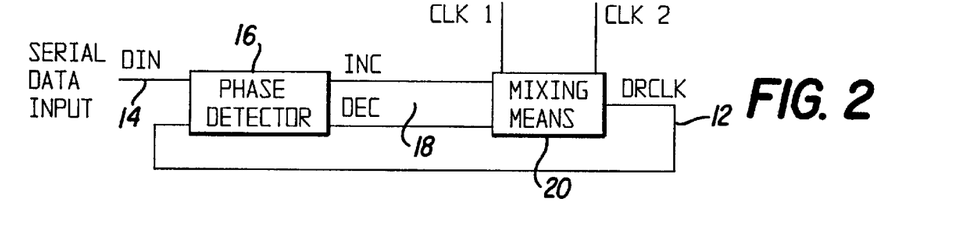
FIG. 2 is a general illustration of the operation of the present invention.

FIG. 2 illustrates in general terms the operation of the preferred embodiments of the present invention. The same reference numerals as were used in FIG. 1 are used in FIG. 2 for corresponding components.

The device in FIG. 2 has input thereto signal 14 and it is arranged to generate output signal 12 which is intended to have a particular phase relationship with the input signal 14. In the following description it will be assumed that signal 12 is intended to be in phase with input signal 14, but it will be apparent that simple alterations can be made to the parameters of operation to achieve any desired phase relationship. In the same way as in FIG. 1 signals 12 and 14 are compared in phase detector 16 which provides output 18 indicating whether the frequency of signal 12 needs to be increased or decreased to bring it more in phase with signal 14.

In FIG. 2 however signal 12 is not generated as the output of a voltage control oscillator. Rather, it is the output of the mixing means 20. Mixing means 20 has input to it two reference signals or clock sources CLK1 and CLK2. Signals CLK1 and CLK2 have the same frequencies as each other but are out of phase, and in the particularly preferred embodiment these two signals are 90° out of phase as illustrated in the phasor diagram in FIG. 3a. Mixing means 20 mixes signals CLK1 and CLK2 in variable proportions in accordance with output 18 from phase detector 16 in order to generate output 12. The proportions in which the signals CLK1 and CLK2 are mixed together vary sinusoidally between −1 and +1 as described in more detail below in order that output signal 12 may have any phase relationship with the reference clock signals.

Figure 3A:
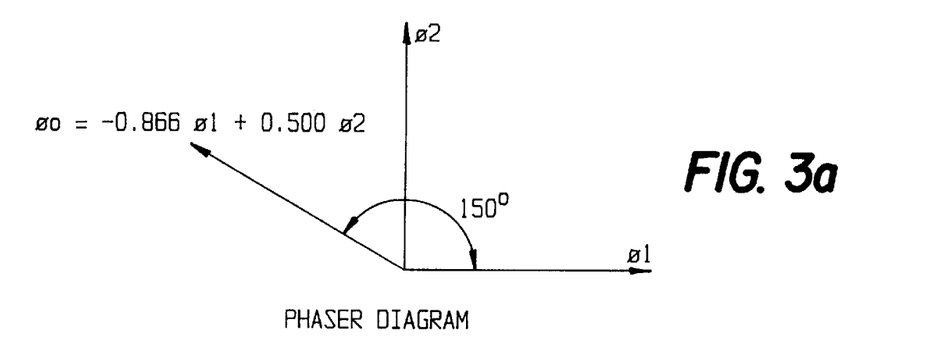
FIGS. 3a and 3b illustrate a preferred relationship between the weighting signals and the reference signals in the preferred embodiments of the invention.

In particular in FIG. 3a the generation of an output signal 150° out of phase with reference CLK1 is illustrated by way of example and it is shown that in order to generate this signal it is necessary to mix reference signals CLK1 and CLK2 in the proportions −0.866 to 0.5. In general, in order to generate a signal having a phase difference P as compared to CLK1 it is necessary to mix reference signals CLK1 and CLK2 in the proportions cos P to sin P.

Figure 3B:
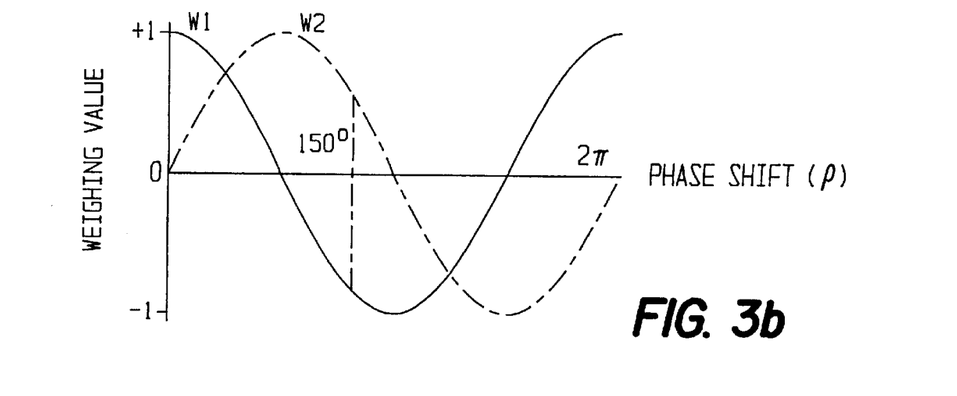

This is illustrated in FIG. 3b where the weighting given to reference signal CLK1 is designated W1 and that given to signal CLK2 is designated W2. FIG. 3b illustrates the values taken by W1 and W2 in order to generate various phase differences P as compared to reference signal CLK1, with 150° again shown as an example.

One implementation of this embodiment is in the context of communication systems, and in particular in the receive side. In such a context, the reference signals CLK1 and CLK2 may be derived from signals generated in the transmit side VCO, but the reference signals may be derived from any suitable source.

Figure 4:
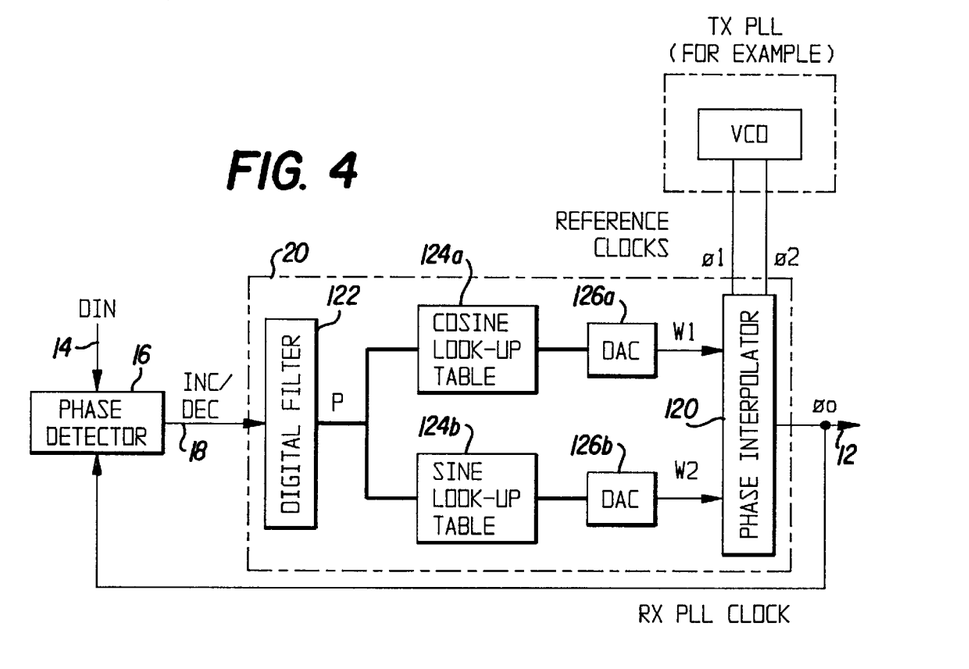
FIG. 4 illustrates a first embodiment of the present invention.

FIG. 4 illustrates one embodiment in which the above sin and cos values are determined using look-up tables. In his embodiment, mixing means 20 comprises digital filter 122 which generates value P according to signal 18 output by phase detector 16. In this figure the reference clock signals are designated φ1 and φ2 and are illustrated, by way of example as being received from a VCO forming part of another PLL. Any other suitable source of clock signals could however be utilised. Value P represents the desired phase difference between reference signal φ1 and output signal 12 in order to keep signal 12 in synchronisation with input signal 14. Once synchronisation has been achieved, signal 18 will not indicate that any increase or decrease in frequency is required to bring the signals into phase, and therefore in such a state digital filter 122 outputs a constant value of P to maintain the established phase relationships. (A slightly different situation occurs if the input signal has a different frequency to the reference signals as discussed below).

As mentioned above, in general terms the desired value of W1 is cos P and the desired value of W2 is sin P. In this embodiment there are therefore provided two look up tables 124a and 124b to which P is applied and which output, in digital form, the cosine and sine of P respectively. These signals are passed through digital to analogue converters 126a and 126b respectively in order to provide analogue signals W1 and W2 for input to phase interpolator 120. Phase interpolator 120 mixes φ1 and φ2 in the proportions determined by W1 and W2 to generate output signal 12.

Thus it is the case that output signal 12 can be locked to be in phase with input signal 14 whatever the phase relationship between input signal 14 and the reference signals φ1 and φ2.

Figure 5:
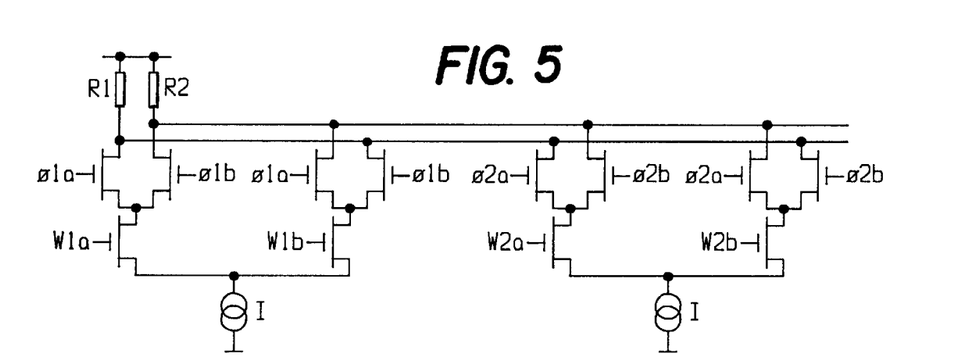
FIG. 5 is an example implementation of the phase interpolator of FIG. 4.

FIG. 5 illustrates one possible implementation of phase interpolator 120 based on differential MOS circuit techniques in which each signal in FIG. 4 is illustrated by two signals in FIG. 5 having corresponding names with a and b suffixes. The implementation illustrated in FIG. 5 enables W1 and W2 to vary over the complete range −1 to +1 enabling phase interpolator 120 to fully implement the functions discussed above.

Digital filter 122 illustrated in FIG. 4 may simply be an up/down counter. This would count up or down according to the polarity of input signal 18 until the desired value of P is being output at which time signal 18 would go to 0 and the value of P would remain constant at its desired locked value. The counter should be arranged to wrap around, when incrementing above the maximum count or decrementing below 0 in order to provide a fully functional device.

The above discussion has been based on the assumption that the reference signals are operating at the same frequency as the input signal and therefore have the same frequency as the desired frequency of signal 12.

The circuit illustrated in FIG. 4 will however also operate in the situation where the frequency of signal 14 and therefore the desired frequency of signal 12 is different from the frequency of the reference signals φ1 and φ2. Such a situation is equivalent to a situation where the phase difference between signal 14 and reference signal φ1 is constantly changing and therefore the value of P must also be constantly changing. This would be achieved in FIG. 4 with no further alternations to the circuit because the "steady state" condition of the circuit would be where signal 18 was constantly indicating a phase difference causing the value of P to change in synchronism with the constantly changing phase difference between signal 14 and reference signal φ1.

This function could be achieved using the simple counter for digital filter 122 mentioned above and this would work satisfactorily for input signals 14 which are constantly providing signal transitions by way of which the phase can be compared by phase detector 16.

Figure 6:
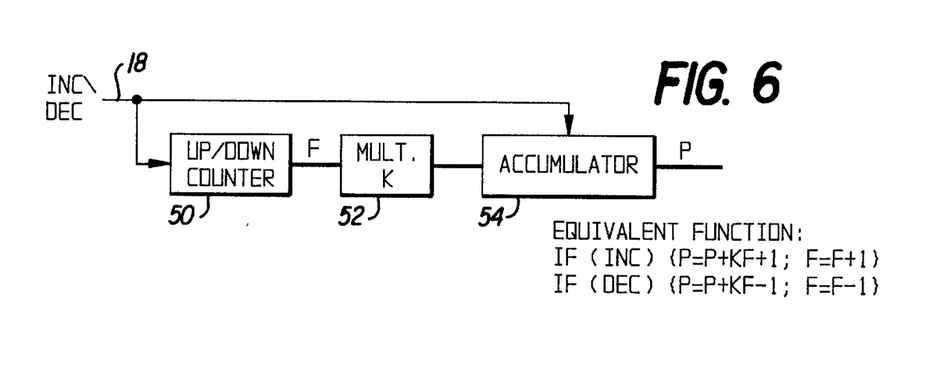
FIG. 6 is a schematic diagram of an embodiment of the digital filter of FIG. 4.

However, in a situation where the input data has a low transition density, that is the input signal may effectively be inactive for lengthy periods of time, the loop will have difficulty tracking the required phase and would have to make significant changes in the phase of output signal 12 each time a burst of activity occurred. FIG. 6 illustrates an alternative implementation of digital filter 122 which overcomes this problem.

Digital filter 122 as illustrated in FIG. 6 comprises a counter 50, a multiplier 52 and an accumulator 54. The signal 18 indicating whether the phase of output signal 12 needs to be increased or decreased in order to achieve synchronism is input both to counter 50 and to accumulator 54. Counter 50 counts up or down according to the value of signal 18 to produce signal F which is multiplied by a constant K in multiplier 52 and is also input to accumulator 54. Accumulator 54 generates a new output value of P by adding, to the existing value of P, the two inputs it receives.

Counter 50 in this implementation effectively integrates the increment/decrement pulses of signal 18 so as to produce the value F. Value F therefore represents the frequency offset between the frequency of the reference signals and desired frequency for signal 12. As mentioned above, this frequency difference is equivalent to a constantly changing phase difference and therefore this can be accounted for by constantly changing the value of P to track this phase difference. The effect of constant K of multiplier 52 and the addition of the multiplied signal into accumulator 54 is to cause signal P to track at the necessary rate of change of phase so as to synchronise with the different frequency signal.

When the loop is locked to the incoming signal, signal 18 will be effectively 0 as there will be no phase difference between the input and the output. In this condition, the steady state is for the value of F×K to be added on each cycle to value P by accumulator 54 to cause the necessary ongoing phase changes to keep the system in synchronism. This will continue even when there is inactivity in the input signal so that, ideally, the system is still synchronised at the time of the next burst. In any event, the level of phase correction required at the beginning of the next burst will be reduced.

The signal 18 is also input directly to accumulator 54 so that when the system is not in the locked condition it will lock in properly and provide a stable system.

Figure 7:
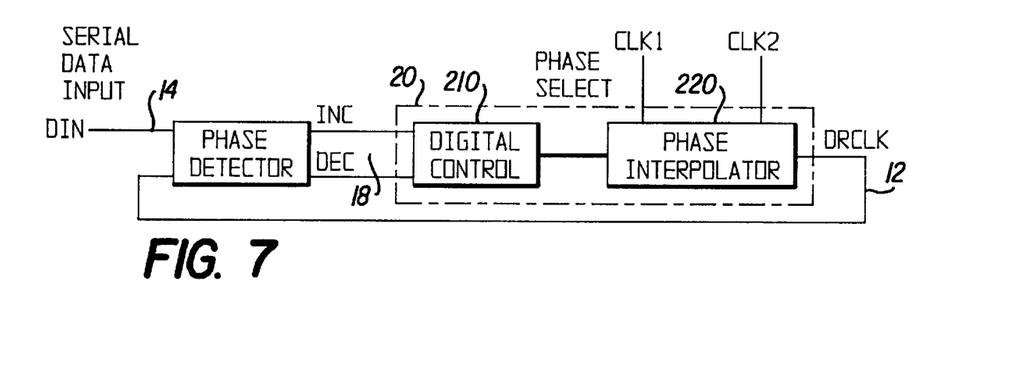
FIG. 7 illustrates a second preferred embodiment of the present invention.

FIG. 7 illustrates a particularly preferred implementation of the invention, the details of which are illustrated in the succeeding figures. It will be seen that the principles behind the implementation are similar to those outlined above, but the actual circuits used are different and, in certain circumstances, more practical.

In the embodiment of FIG. 7, mixing means 20 comprises a digital control means 210 and phase interpolator 220, and the embodiment is described in terms of clock memory based on a serial data input.

As with the embodiment described above, a standard phase detector circuit 16 is used to compare the positions of the edges in the serial data input 14 with the phase of the data recovery clock 12. This produces phase increment/decrement control signals which are fed into digital logic block 210 which generates a control word representing the required phase of the data recovery clock. The digital phase select value is then applied to the phase interpolator 220 which uses an analogue mixer to derive the required data recovery clock phase from the two reference clock phases.

An optional reference regeneration circuit may be included to restore the quadrature phase relationship between the reference clock phases, thus allowing the effects of skew due to distribution of the clocks to be reduced. Details of this regeneration circuit are set out below.

Figure 8:
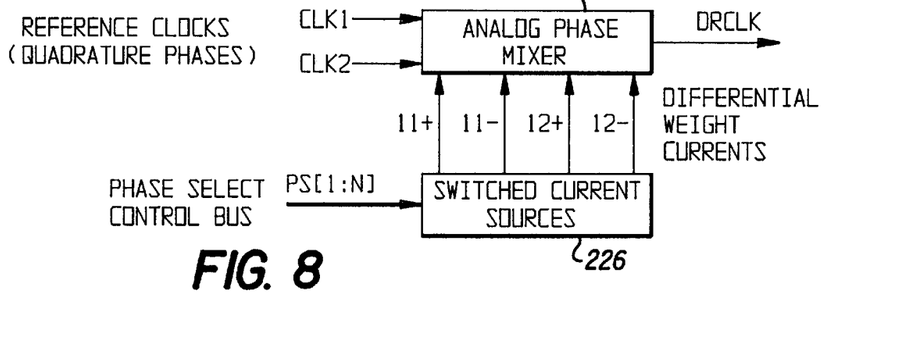
FIG. 8 illustrates the phase interpolator in the embodiment of FIG. 7.

Broadly, as illustrated in FIG. 8 the phase interpolator 220 in his embodiment is formed of an analogue phase mixer 222 and a digitally controlled current source block 226. The current source block 226 provides current signals to the phase mixer 222 to provide, as discussed in more detail below, the weightings in which the reference signals CLK1 and CLK2 should be mixed.

Figure 9:
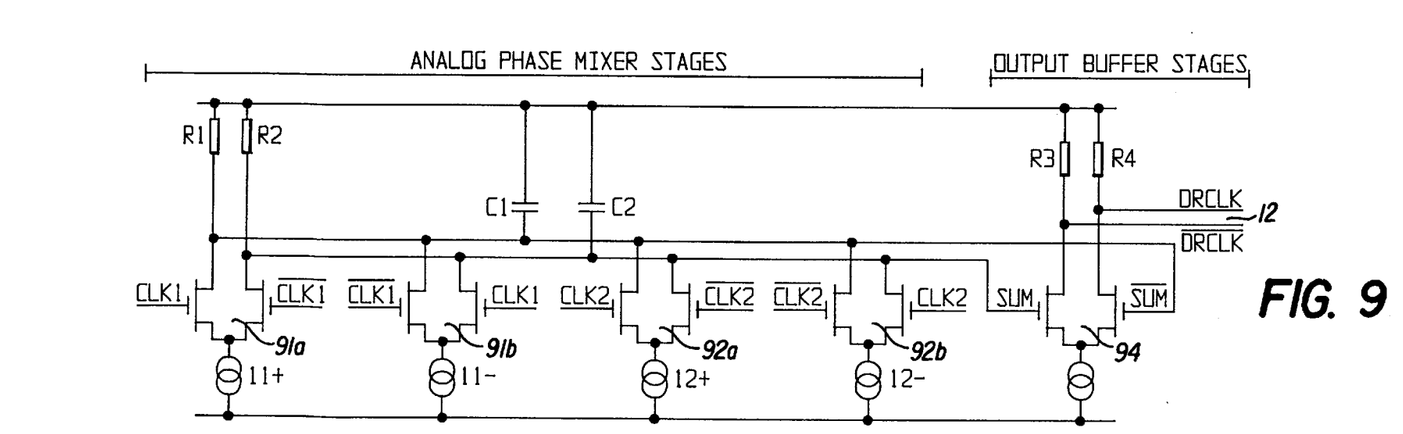
FIG. 9 illustrates the phase mixer in the embodiment of FIG. 8.

A schematic illustration of an implementation of the phase mixer 222 based on differential techniques, in which each signal is represented by a pair of signal lines, is shown in FIG. 9. The required weightings for the reference signals are provided by the current source block 226 as currents I1+, I1−, I2+, I2− which appear as current sources in FIG. 9. The circuit of FIG. 9 sums the reference clock signals according to the weights of their control currents to generate a Sum signal represented by the differential voltage developed across load resistors R1 and R2

The load capacitances (C1 and C2) are optional and may be included to filter out harmonics of the clock signals to reduce distortion of the Sum signal. The described operation assumes the use of sinusoidal reference clock signals. However, square clocks may also be used but require filtering either by C1 and C2, and/or by the intrinsic bandwidth limit of the phase summing circuit.

Phase mixer 222 comprises four differential amplifiers 91a, 91b, 92a, 92b each of which includes two transistors as illustrated in a conventional fashion. Reference clock CLK1 is applied as shown to amplifiers 91a and 91b with opposite polarities. The provision of two amplifiers connected with opposite polarities means that one acts to add the reference clock to the Sum signal, while the other subtracts it. The current sources I1+, I1− control the relative extents to which the amplifiers add and subtract the reference signal, and thus the current pair I1+ and I1− constitute a differential current weighting representing W1 in FIG. 3 above enabling W1 to be adjusted from +1 to −1.

The values of I1+and, I1− are set by current source block 226 which keeps the total $I_{tot}$=(I1+)+(I1−) constant. The value of W1 is therefore represented by appropriate selection of I1+ and I1−. In particular, $$\frac{I1+}{I_{tot}} = \frac{1}{2}(W1 + 1) \text{ and } \frac{I1-}{I_{tot}} = \frac{1}{2}(1 - W1)$$

which means that, for instance when:

W1=+1:I1=$I_{tot}$; I1=0

W1=−1:I1=0; I1−+$I_{tot}$

W1=0:I1+=I1−=$I_{tot}$/2.

Current source pair I2+, I2− are similarly varied between 0 and $I_{tot}$ in order to represent the value of W2 between +1 and −1 and these are associated with amplifiers 92a, 92b to which the reference clock CLK2 is applied with opposite polarities.

In summary then, by varying the weight currents I1+, I1−, I2+, I2− the weightings W1, W2 for the reference clocks CLK1, CLK2 can be varied as discussed above in relation to FIG. 3 such that the phase of the Sum signal can be varied over a whole cycle.

Finally, the Sum signal is buffered using a second differential amplifier stage 94 to "square up" the signal and remove any amplitude variation resulting from the phase mixing operation to generate the second clock signal 12.

The differential weighting currents I1+, I1−, I2+, I2− are generated by block 226 by digitally controlling a set of switched current sources, which will be described in detail later. From the above discussion it will be understood that any one desired phase difference from, say, reference CLK1 defines a pair of values W1, W2 and accordingly a set of I1+, I1−, I2+, I2−. The particular phase required is indicated to block 226 by the digital control word output by digital control means 210 as the phase select signal.

In this embodiment, in order to simplify the generation of the current weightings the digital control value is encoded using a Johnson (twisted-ring) counter type code. This uses an N-bit word, PS[1:N], (where N is an even integer) to define 2N possible code values which are used to designate 2N available phase steps which may be output by the interpolator.

The value of N therefore effectively determines the phase resolution of the clock alignment circuitry: since there are 2N phase steps over one complete cycle (2π radians), the phase resolution is π/N radians. The value of N is therefore chosen to trade off phase resolution with complexity. The described embodiment assumes a value of N=6, thus providing a phase alignment resolution of 1/12th of a cycle (ie. 30°). The 12 possible code values for a 6-bit implementation of the phase select are as follows:

| Step | PS[1:6] | Step | PS[1:6] |
|---|---|---|---|
| 0 | 111111 | 6 | 000000 |
| 1 | 011111 | 7 | 100000 |
| 2 | 001111 | 8 | 110000 |
| 3 | 000111 | 9 | 111000 |
| 4 | 000011 | 10 | 111100 |
| 5 | 000001 | 11 | 111110 |

Figure 10:
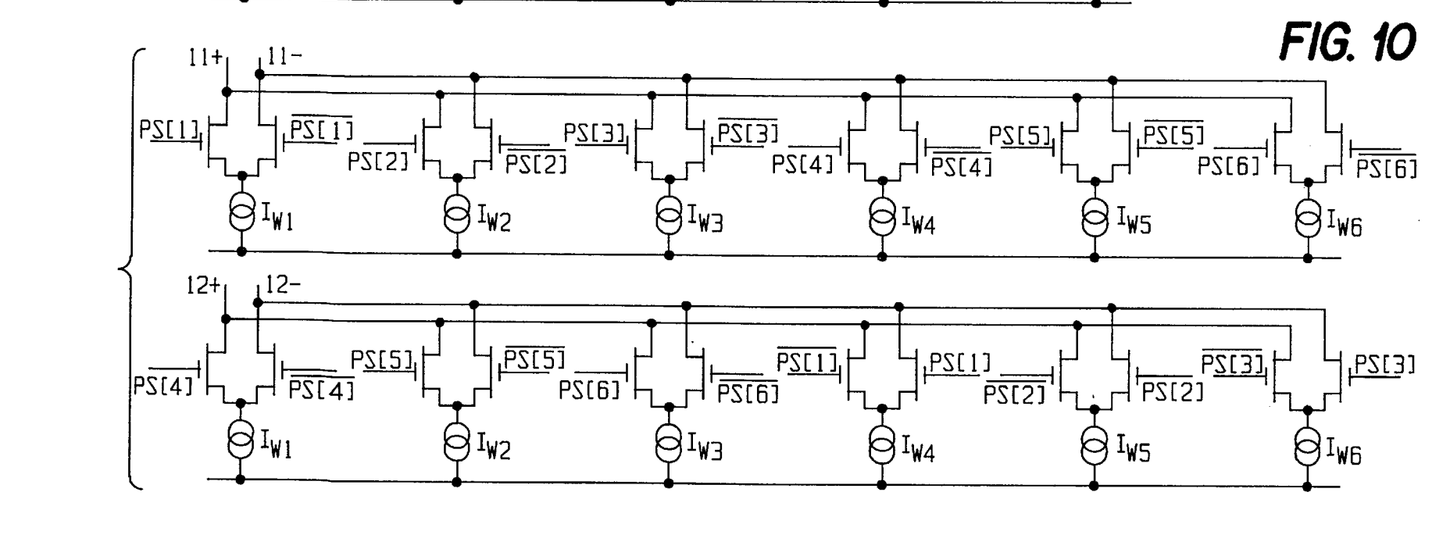
FIG. 10 illustrates the current source block in the embodiment of FIG. 8.

FIG. 10 illustrates the implementation of current source block 226 which, as shown, comprises a plurality of current sources providing currents $I_{W1}$ ... $I_{W6}$ each having a pair of transistors associated with it to which inverted and non-inverted versions of the bits of the code value are applied respectively as shown. As shown in FIG. 10, the same selection of current values is used to generate both I1+, I1− and I2+, I2−. As shown, two separate sets of matching current sources are provided, one for each of I1+, I1− and I2+, I2−. However, it may be possible to use one set of cm-Tent sources together with appropriate timing and switching circuitry to generate alternately I1+, I1− and I2+, I2−.

An advantage of using this coding scheme is that the weighting controls for the two different phases can be derived from the same set of control lines: for W2 the control word needs to be rotated by N/2 bits, inverting the bits that are wrapped around. This can effectively be achieved simply by swapping over the control lines of the differential current switches as illustrated in FIG. 10.

Figure 11:
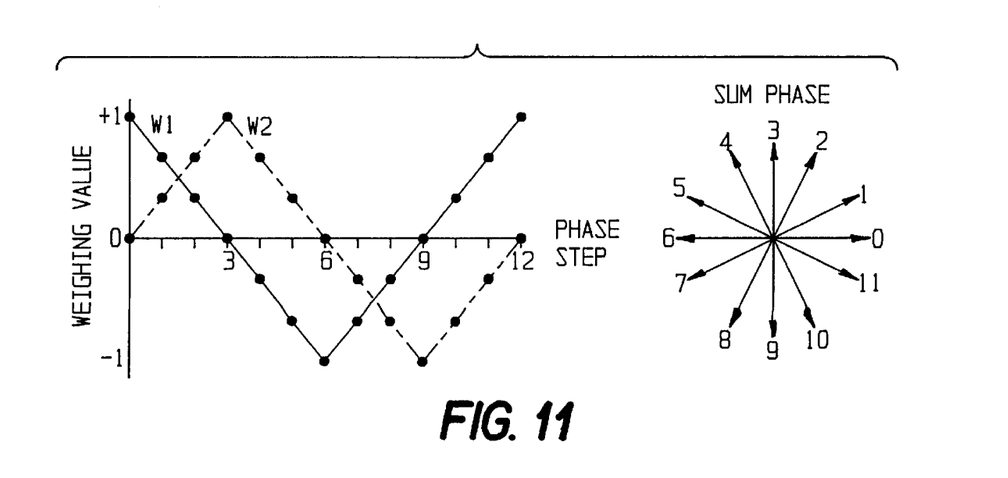
FIG. 11 illustrates a first coding scheme representing the phase steps in the embodiment of FIG. 7.

In a simple arrangement, each of $I_{W1} \ldots I_{W6}$ may have the same magnitude in such an arrangement twelve different phase outputs for the twelve phase steps would be generated as illustrated in FIG. 11, which illustrates the equivalent values of W1 and W2 which would be obtained and the corresponding phase diagram. This is also represented in the following table.

| Phase Step | PS[1:6] | W1 | W2 | Sum Phase |
|---|---|---|---|---|
| 0 | 111111 | +1.00 | 0.00 | 0 |
| 1 | 011111 | +0.67 | +0.33 | 27 |
| 2 | 001111 | +0.33 | +0.67 | 63 |
| 3 | 000111 | 0.00 | +1.00 | 90 |
| 4 | 000011 | −0.33 | +0.67 | 117 |
| 5 | 000001 | −0.67 | +0.33 | 153 |
| 6 | 000000 | −1.00 | 0.00 | 180 |
| 7 | 100000 | −0.67 | −0.33 | 207 |
| 8 | 110000 | −0.33 | −0.67 | 243 |
| 9 | 111000 | 0.00 | −1.00 | 270 |
| 10 | 111100 | +0.33 | −0.67 | 297 |
| 11 | 111110 | +0.67 | −0.33 | 333 |

Figures 12, 13, 14:
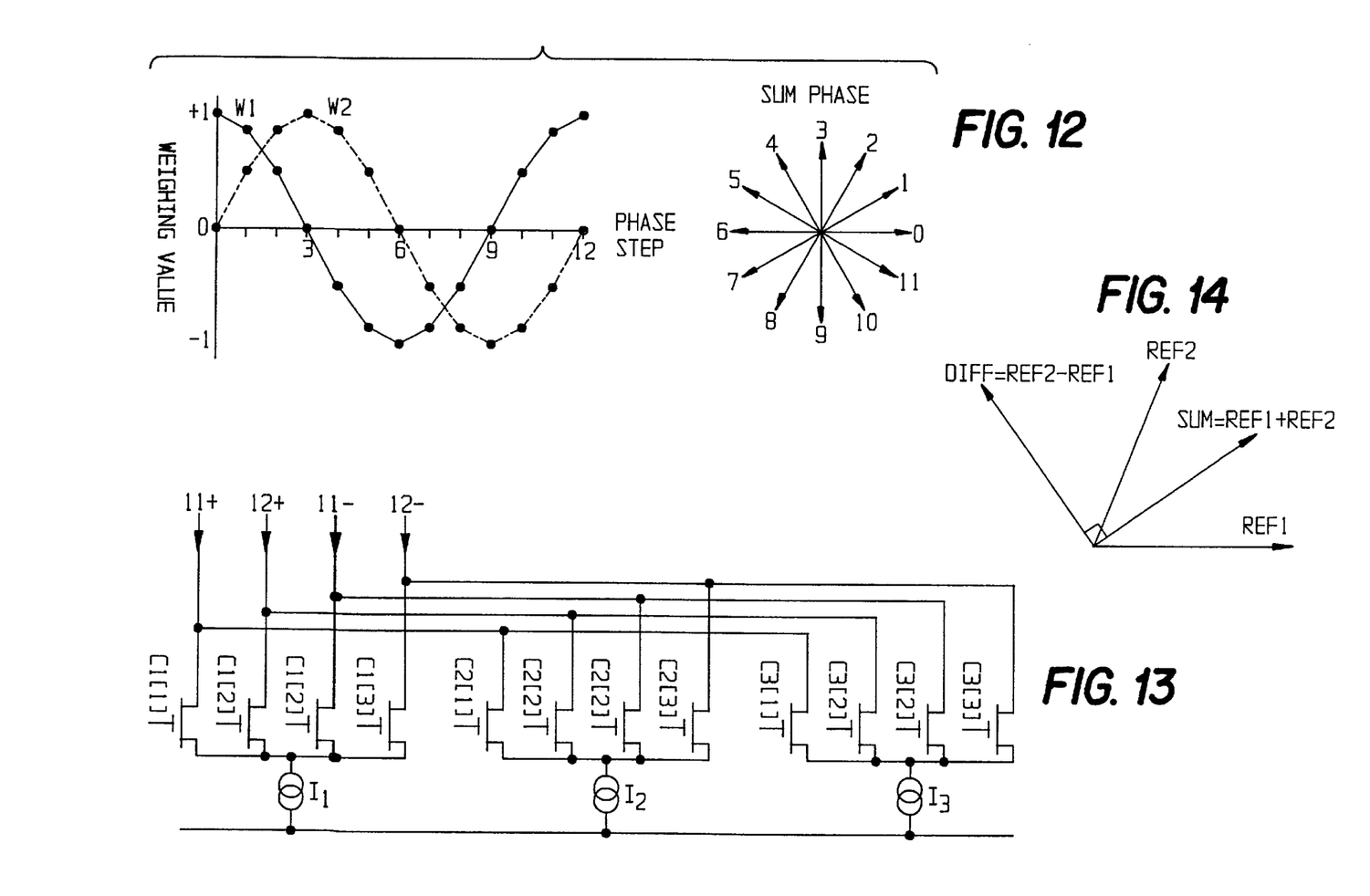
FIG. 12 illustrates a second coding scheme representing the phase steps in the embodiment of FIG. 7.
FIG. 13 illustrates the operation of an alternative current weighting control arrangement.
FIG. 14 illustrates the principle of operation of a further aspect of the present invention.

It will be seen that this provides variations in the phase step size around the cycle. This may not present problems in some circumstances, but a constant step size providing optimum phase resolution can be obtained by setting the current weightings according to the following:

$$I_{Wm} = Itot/2 \cdot [(\cos((m-1)\pi/N) - \cos(m\pi/N)]$$

where m=1 ... N e.g. for N=6
$I_{W1}$=0.067 Itot
$I_{W2}$=0.183 Itot
$I_{W3}$=0.250 Itot
$I_{W4}$=0.250 Itot
$I_{W5}$=0.183 Itot
$I_{W6}$=0.067 Itot This arrangement provides sinusoidal variations in the equivalent values of W1 and W2 and even phase step size as illustrated in FIG. 12, which corresponds to FIG. 11 in format, and as represented in the following table.

| Phase Step | PS[1:6] | W1 | W2 | Sum Phase |
|---|---|---|---|---|
| 0 | 111111 | +1.00 | 0.00 | 0 |
| 1 | 011111 | +0.87 | +0.50 | 30 |
| 2 | 001111 | +0.50 | +0.87 | 60 |
| 3 | 000111 | 0.00 | +1.00 | 90 |
| 4 | 000011 | −0.50 | +0.87 | 120 |
| 5 | 000001 | −0.87 | +0.50 | 150 |
| 6 | 000000 | −1.00 | 0.00 | 180 |
| 7 | 100000 | −0.87 | −0.50 | 210 |
| 8 | 110000 | −0.50 | −0.87 | 240 |
| 9 | 111000 | 0.00 | −1.00 | 270 |
| 10 | 111100 | +0.50 | −0.87 | 300 |
| 11 | 111110 | +0.87 | −0.50 | 330 |

This sinusoidal current weighting is more advantageous for large values of N, ie. where a fine clock phase resolution is required. However, for example, if N=4 (ie. ⅛ cycle resolution) the performance of the triangular and sinusoidal weighting schemes are virtually equivalent.

If performance offered by the triangular current weighting schemes is sufficient the current control can be implemented using an alternative arrangement illustrated in FIG. 13 and represented by the following table.

| Phase Step | C1 [1:4] | C2[1:4] | C3[1:4] | I1+ | I2+ | I1− | I2− | W1 | W2 | Sum Phase |
|---|---|---|---|---|---|---|---|---|---|---|
| 0 | 1000 | 1000 | 1000 | 3 | 0 | 0 | 0 | +1.00 | 0.00 | 0 |
| 1 | 0100 | 1000 | 1000 | 2 | 1 | 0 | 0 | +0.67 | +0.33 | 27 |
| 2 | 0100 | 0100 | 1000 | 1 | 2 | 0 | 0 | +0.33 | +0.67 | 63 |
| 3 | 0100 | 0100 | 0100 | 0 | 3 | 0 | 0 | 0.00 | +1.00 | 90 |
| 4 | 0010 | 0100 | 0100 | 0 | 2 | 1 | 0 | −0.33 | +0.67 | 117 |
| 5 | 0010 | 0010 | 0100 | 0 | 1 | 2 | 0 | −0.67 | +0.33 | 153 |
| 6 | 0010 | 0010 | 0010 | 0 | 0 | 3 | 0 | −1.00 | 0.00 | 180 |
| 7 | 0001 | 0010 | 0010 | 0 | 0 | 2 | 1 | −0.67 | −0.33 | 207 |
| 8 | 0001 | 0001 | 0010 | 0 | 0 | 1 | 2 | −0.33 | −0.67 | 243 |
| 9 | 1000 | 0001 | 0001 | 0 | 0 | 0 | 3 | 0.00 | −1.00 | 270 |
| 10 | 1000 | 0001 | 0001 | 1 | 0 | 0 | 2 | +0.33 | −0.67 | 297 |
| 11 | 1000 | 1000 | 0001 | 2 | 0 | 0 | 1 | +0.67 | −0.33 | 333 |

This is based on the use of a set of 4:1 current switches to switch equally-weighted current sources $I_1$, $I_2$, $I_3$ onto one of the 4 differential amplifier control currents. This scheme uses only half the number of current sources as the previous arrangement, and a different coding scheme, The number of current sources/switches again determines the resolution of the clock steps. For example, if M current sources are used, each with a 4:1 current switch, this provides 4 M phase steps across one cycle (but also requires 4 M control lines). The example shown in FIG. 8 uses 3 current sources to provide a ¹⁄₁₂ cycle resolution.

In the description of the embodiments above, it is assumed that the two reference clocks are in quadrature, ie, separated in phase by π/2 radians (90°). While it is possible to design the overall circuit to use reference clocks having a different phase separation, this increases the complexity of the calculation and the circuitry required to set the weighting values for the mixing means. In any event it will always be important to know the phase separation between the reference clocks when determining the weighting values to ensure proper functioning of the circuit.

The invention therefore further provides an arrangement which outputs a pair of reference signals known to have a phase separation of π/2 from a pair of signals known to have some phase separation, but which phase separation is not known exactly. Such an arrangement is advantageous in situations where for example the clock signals are distributed across a chip or circuit board. In such a situation it is possible that some differences in delay may occur between the clocks due to track length or loading, thus altering the phase relationship between the clocks from that which is expected and therefore degrading operation of the circuit.

The principle of operation is illustrated in FIG. 14 which is a phasor diagram in which Ref 1 and Ref 2 are received reference clocks. From Ref 1 and Ref 2 are generated sum and difference signals of Ref 1 and Ref 2. It will be appreciated that, if Ref 1 and Ref 2 have the same magnitude then the phase separation between the sum and difference signals is π/2. Once the magnitudes of the sum and difference signals are equalised therefore, these signals are known to have fixed phase separation and can be used in the embodiments described above.

Figure 15:
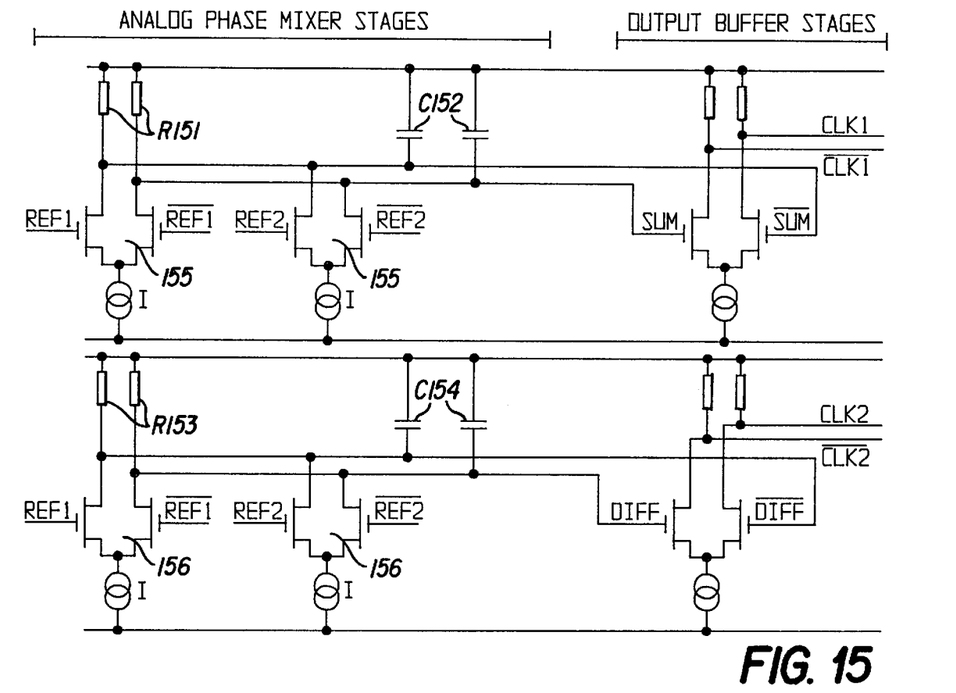
FIG. 15 illustrates an implementation of the principles illustrated in FIG. 14.

FIG. 15 illustrates a preferred implementation of this clock phase regeneration arrangement, and it will be seen that this circuit is similar to the phase mixer described above.

The upper part of FIG. 15 generates the sum signal and comprises two differential circuits 155 to which Ref 1 and Ref 2 are applied as shown and which each have a current source I associated with it. The balanced current sources provide equal weightings to Ref 1 and Ref 2 and the sum signal is generated across loading resistors R151 and optional loading capacitors C152.

The lower part of FIG. 15 correspondingly generates the difference signal, and correspondingly comprises differential circuits 156, current sources I, loading resistors R153 and optional loading capacitors C154. The difference signal is generated by the reversal of the connection of Ref 1 and can be seen from a comparison between the upper and lower parts of FIG. 15, Also, an output buffer stage is provided for each of the sum and difference signals after which the signals CLK1 and CLK2 are output for use in the embodiments described above.

In principle, this technique could be used to distribute a pair of clocks over an unlimited distance with no accumulated error in their phase difference. Clock regeneration circuits as described above would be provided along the clock path functioning as repeaters.

In the context of the clock recovery from data signals as described in the embodiments above, this may be particularly useful in situations where multiple channels of data are being received. In such an arrangement, this pair of clock signals could simply be passed from one channel to the next with phase regeneration being performed as necessary to ensure that quadrature reference signals are available for each channel.

Figure 16:
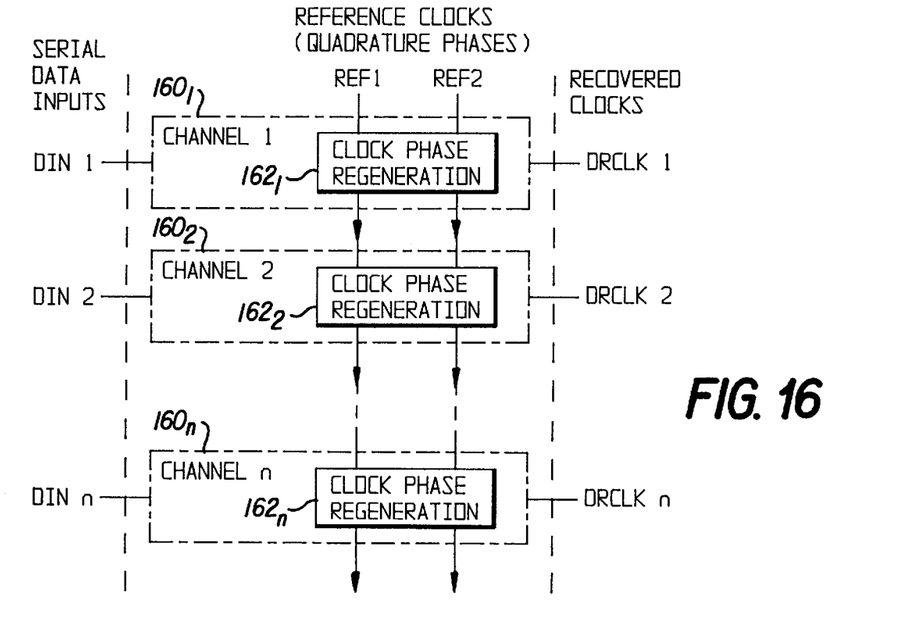
FIG. 16 illustrates a further exemplary embodiment of the invention.

Such an arrangement is schematically illustrated in FIG. 16 in which clock signals are recovered from received data channels Din.1, Din.2 . . . Din.n. For this purpose, a pair of reference clocks Ref 1, Ref 2 are provided from an external source. For each channel a clock recovery circuit 160₁, 160₂, . . . 160ₙ is provided and Ref 1 and Ref 2 are applied to circuit 160₁. Each of circuits 160 corresponds to a clock recovery circuit for instance according to one of the embodiments described in detail above and further includes a clock phase regeneration circuit 162.

Reference clocks Ref 1, Ref 2 are applied to channel 1 when circuit 162₁ regenerates their phase relationship and the resulting signals are used to recover clock DRCLK1 and are also passed to channel 2. Correspondingly circuit 162₂ regenerates the phase relationship for recovery of clock DRCLK2 and handing on to channel 3. Depending on the physical layout of the circuitry it may not be necessary to regenerate the phase at every step, but providing regeneration as necessary results in a simple overall arrangement then local generation of the clock references for each channel.

This phase regeneration arrangement is also applicable to other circumstances in which quadrature related clock signals are required.

We claim:

1. Apparatus for generating an oscillating output signal having a desired phase relationship with an input signal, comprising:

mixing means arranged to receive first and second reference signals oscillating at a common frequency and having a phase offset between them, and to mix said first and second reference signals in variable proportions to generate said output signal; and comparing means arranged to compare the phase of said output signal with said input signal and to provide a comparison output signal indicative of whether the phase of said generated output signal is in said desired phase relationship with said input signal;

said mixing means being responsive to said comparison output signal to alter said proportions in which said first and second reference signals are mixed.

2. Apparatus according to claim 1 in which said first and second reference signals are in quadrature relationship with each other.

3. Apparatus according to claim 2 in which said mixing means is arranged to mix said first and second reference signals in proportions which vary sinusoidally with the required phase difference between the output and one of said first and second reference signals.

4. Apparatus according to claim 3 in which the mixing proportion for each of said reference signals is represented by a pair of differential weight current signals.

5. Apparatus according to claim 4 in which said mixing means comprises a plurality of differential amplifiers with each reference signal being applied to two of said differential amplifiers with opposite polarity and current in said two differential amplifiers being supplied respectively by the corresponding pair of differential weight current signals, the sum of the outputs of said differential amplifiers being used to provide said output signal.

6. Apparatus according to claim 1 in which said mixing means comprises means arranged to output a signal indicative of the desired phase relationship between said output signal and one of said reference signals.

7. Apparatus according to claim 4 in which said mixing means comprises means arranged to output a multi-bit signal indicative of the desired phase relationship between said output signal and one of said reference signals, and current mixing means comprising a plurality of current sources, the outputs of which are selectively added together according to the values of bits in said multi-bit signal to output said differential weight current signals.

8. Apparatus according to claim 7 in which said plurality of current sources are all of the same current value.

9. Apparatus according to claim 7 in which the current values of said current sources differ from each other to facilitate the generation of differential weight current signals representing mixing proportions for said reference signals which result in evenly phase spaced output signals.

10. Apparatus according to claim 1 in which said mixing means comprises means arranged to output a signal indicative of the desired phase relationship between said output signal and one of said reference signals, and look-up table means arranged to derive from said signal said mixing proportions.

11. Apparatus according to claim 10 in which said look-up table means comprise sine and cosine tables.

12. Apparatus for generating an oscillating output signal having a desired phase relationship with an input signal utilising an input pair of signals oscillating at a common frequency and having a phase difference therebetween, comprising:

summing means arranged to sum said input pair of signals to generate a first signal;

difference means arranged to subtract one of said input signals from the other to generate a second signal;

reference signal generating means arranged to generate a pair of quadrature related reference signals from said first and second signals;

mixing means arrranged to mix said reference signals in variable proportions to generate said output signal; and comparing means arranged to compare the phase of said output signal with said input signal and to provide a comparison output signal indicative of whether the phase of said generated output signal is in said desired phase relationship with said input signal;

said mixing means being responsive to said comparison output signal to alter said proportions in which said reference signals are mixed.

13. Apparatus according to claim 12 in which said input pair of signals have a common magnitude.

14. Apparatus according to claim 12 in which said reference signal generating means provides said first and second signals.

15. Apparatus according to claim 12 in which said reference signal generating means comprises means arranged to equalise the magnitudes of said first and second signals in order to provide said reference signals.

\* \* \* \* \*